(12) United States Patent
Tavassoli et al.

(10) Patent No.: US 9,248,509 B2
(45) Date of Patent: Feb. 2, 2016

(54) MULTI-ZONED PLASMA PROCESSING ELECTROSTATIC CHUCK WITH IMPROVED TEMPERATURE UNIFORMITY

(71) Applicants: Hamid Tavassoli, Cupertino, CA (US); Surajit Kumar, Sunnyvale, CA (US); Kallol Bera, San Jose, CA (US); Xiaoping Zhou, San Jose, CA (US); Shane C. Nevil, Livermore, CA (US); Douglas A. Buchberger, Jr., Livermore, CA (US)

(72) Inventors: Hamid Tavassoli, Cupertino, CA (US); Surajit Kumar, Sunnyvale, CA (US); Kallol Bera, San Jose, CA (US); Xiaoping Zhou, San Jose, CA (US); Shane C. Nevil, Livermore, CA (US); Douglas A. Buchberger, Jr., Livermore, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 14/447,557

(22) Filed: Jul. 30, 2014

(65) Prior Publication Data
US 2014/0346743 A1    Nov. 27, 2014

Related U.S. Application Data

(63) Continuation of application No. 13/081,412, filed on Apr. 6, 2011, now Pat. No. 8,822,876.

(60) Provisional application No. 61/393,698, filed on Oct. 15, 2010.

(51) Int. Cl.
*B23K 10/00* (2006.01)
*B23B 31/28* (2006.01)
*H01L 21/67* (2006.01)
*H01L 21/683* (2006.01)
*H05H 1/46* (2006.01)
*B23Q 3/15* (2006.01)

(52) U.S. Cl.
CPC . *B23B 31/28* (2013.01); *B23Q 3/15* (2013.01); *H01L 21/67069* (2013.01); *H01L 21/6833* (2013.01); *H05H 1/46* (2013.01); *B23B 2231/24* (2013.01); *Y10T 279/23* (2015.01)

(58) Field of Classification Search
CPC .... B23Q 3/15; Y10T 279/23; B23B 2231/24; H05H 1/46; H05H 1/28
USPC ............... 219/121.4, 121.43, 121.49, 121.48; 118/723 R, 724, 725; 156/345.52, 156/345.53, 345.34, 345.47
See application file for complete search history.

(56) References Cited

U.S. PATENT DOCUMENTS

2005/0211385 A1* 9/2005 Benjamin et al. ......... 156/345.52
2006/0076109 A1* 4/2006 Holland et al. .......... 156/345.27

* cited by examiner

*Primary Examiner* — Mark Paschall
(74) *Attorney, Agent, or Firm* — Blakley, Sokoloff, Taylor & Zafman LLP

(57) ABSTRACT

An electrostatic chuck assembly including a dielectric layer with a top surface to support a workpiece. A cooling channel base disposed below the dielectric layer includes a plurality of inner fluid conduits disposed beneath an inner portion of the top surface, and a plurality of outer fluid conduits disposed beneath an outer portion of the top surface. A chuck assembly includes a thermal break disposed within the cooling channel base between the inner and outer fluid conduits. A chuck assembly includes a fluid distribution plate disposed below the cooling channel base and the base plate to distribute a heat transfer fluid delivered from a common input to each inner or outer fluid conduit. The branches of the inner input manifold may have substantially equal fluid conductance.

16 Claims, 6 Drawing Sheets

MULTI-ZONED PLASMA PROCESSING ELECTROSTATIC CHUCK WITH IMPROVED TEMPERATURE UNIFORMITY

CROSS-REFERENCE TO RELATED APPLICATIONS

This application claims the benefit of U.S. application Ser. No. 13/081,412 filed on Apr. 6, 2011, and U.S. Provisional Application No. 61/393,698 filed on Oct. 15, 2010, both entitled "MULTI-ZONED PLASMA PROCESSING ELECTROSTATIC CHUCK WITH IMPROVED TEMPERATURE UNIFORMITY," the entire contents of which are hereby incorporated by reference herein.

This application is related to U.S. Pat. No. 8,629,370 issued Jan. 14, 2014 and U.S. Provisional Application No. 61/393,716 filed on Oct. 15, 2010, both entitled "ASSEMBLY FOR DELIVERING RF POWER AND DC VOLTAGE TO A PLASMA PROCESSING CHAMBER.

FIELD

Embodiments of the present invention relate to the microelectronics manufacturing industry and more particularly to temperature controlled chucks for supporting a workpiece during plasma processing.

DISCUSSION OF RELATED ART

Power density in plasma processing equipment, such as those designed to perform plasma etching of microelectronic devices and the like, is increasing with the advancement in fabrication techniques. For example, powers of 5 to 10 kilowatts are now in use for 300 mm substrates. With the increased power densities, enhanced cooling of a chuck is beneficial during processing to control the temperature of a workpiece uniformly. Control over workpiece temperature and temperature uniformity is made more difficult where rapid temperature setpoint changes are desired, necessitating a chuck be designed with smaller thermal time constants. Designs with smaller thermal time constants generally suffer more from localized hot and cold spots as a function of how heating or cooling power is applied to the chuck. For example, a coolant loop designed for a legacy chuck installed into a contemporary chuck designed for higher power applications will typically result in the formation of a pattern on the workpiece which matches the coolant loop due to process variation induced by localized temperature variation.

Uniform application of heating/cooling power to a chuck is further hindered by the need to deliver both higher RF power and DC voltages to electrostatically clamp a workpiece to the chuck. Both RF power and DC voltage are also to be delivered in a uniform manner, making their individual routing within a chuck competitive with that of heat/cooling power.

SUMMARY

Embodiments include an electrostatic chuck (ESC) assembly for supporting a workpiece during a manufacturing operation in a processing chamber, such as a plasma etch, clean, deposition system, or the like, which utilizes the chuck assembly. In embodiments, a chuck assembly includes a dielectric layer with a top surface to support the workpiece. Inner fluid conduits are disposed in a base, below the dielectric layer, beneath an inner portion of the top surface. Outer fluid conduits are disposed in the base beneath an outer portion of the top surface. Each of the inner and outer fluid conduits may include two, three, or more fluid conduits arranged with azimuthal symmetry about a central axis of the chuck assembly. The fluid conduits are to conduct a heat transfer fluid, such as Galden, Fluorinert, ethylene glycol/water, or the like to heat/cool the top surface of the chuck and workpiece disposed thereon. In embodiments, an outlet of an inner fluid conduit is positioned at a radial distance of the chuck which is between an inlet of the inner fluid conduit and an inlet of an outer fluid conduit. The proximity of the two inlets to the outlet improving temperature uniformity of the top surface.

In embodiments, a chuck assembly includes a thermal break disposed within the cooling channel base between the inner and outer fluid conduits to improve the independence of temperature control between the inner and outer portions of the top surface. Depending on the embodiment, the thermal break includes a void or a second material with a higher thermal resistance value than that of the base material. In certain embodiments, the thermal break forms an annulus encircling an inner portion of the top surface. In further embodiments, where a chuck assembly includes an RF electrode disposed below the dielectric layer, the thermal break extends into the RF electrode.

In embodiments, a chuck assembly includes a fluid distribution plate disposed below the ESC. The fluid distribution plate serves as a manifold for the distribution of a heat transfer fluid delivered from a common input to each of the inner or outer fluid conduits. In embodiments, the fluid distribution plate includes an inner input manifold having a common upstream end branched to a plurality of downstream ends. Each downstream end is coupled to one of the inner fluid conduits and the branches of the inner input manifold may have substantially equal fluid conductance. The fluid distribution plate may further include an outer input manifold having a common upstream end branched to a plurality of downstream ends, each downstream end coupled to one of the outer fluid conduits. The branches of the outer input manifold may have substantially equal fluid conductance.

DETAILED DESCRIPTION

In the following description, numerous specific details are set forth to provide a thorough understanding of the present invention. It will be apparent to one skilled in the art that the present invention may be practiced without these specific details. In other instances, well-known features, such as specific chambers, materials, and machining techniques, are not described in detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. Also, it is to be understood that the various exemplary embodiments shown in the figures are merely illustrative representations and are not necessarily drawn to scale.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicate that two or more elements are in either direct or indirect (with other intervening elements between them) physical or electrical contact with each other, and/or that the two or more elements co-operate or interact with each other (e.g., as in a cause an effect relationship).

Figure 1:
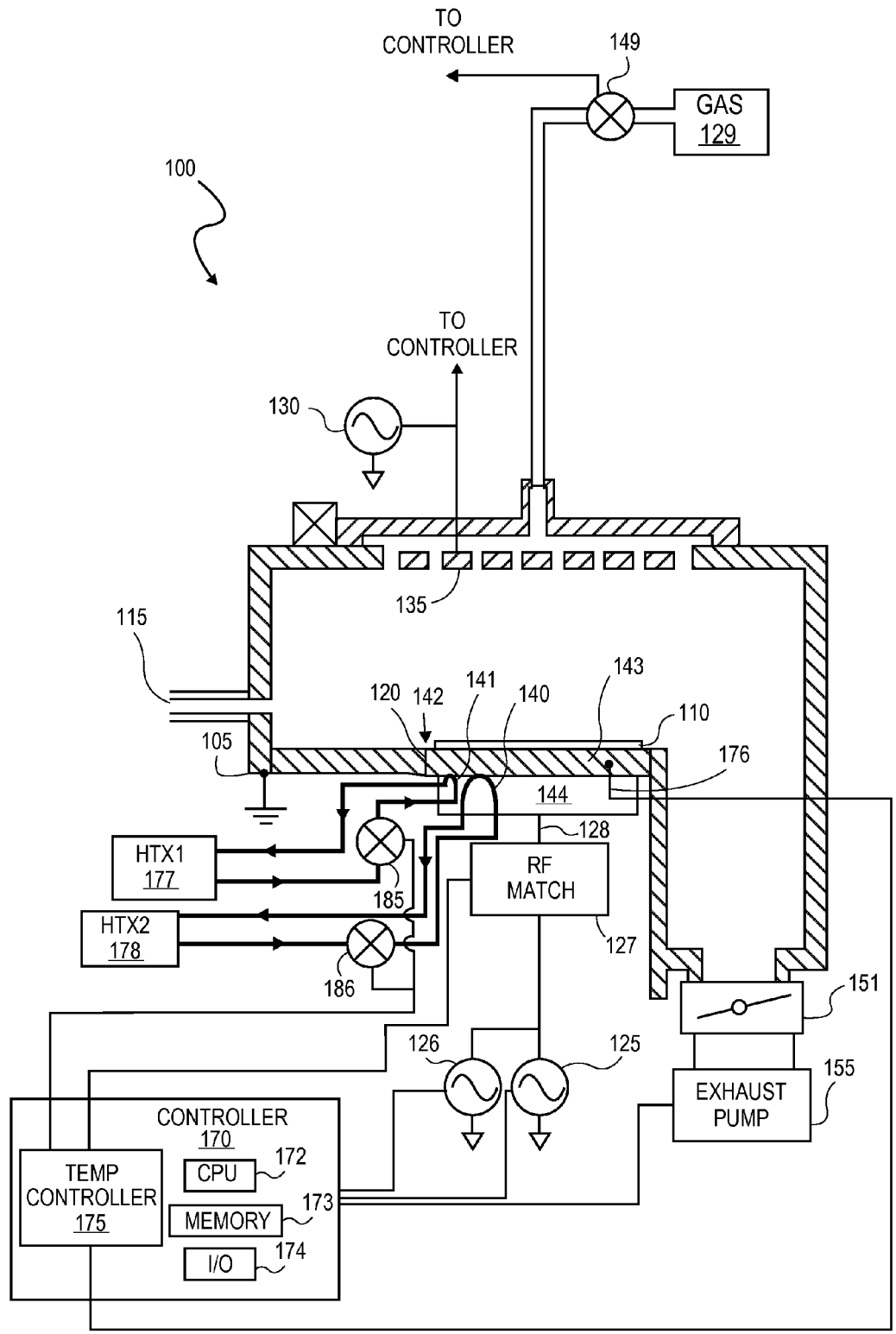
FIG. 1 is a schematic of a plasma etch system including a chuck assembly in accordance with an embodiment of the present invention.

FIG. 1 is a schematic of a plasma etch system 100 including a chuck assembly 142 in accordance with an embodiment of the present invention. The plasma etch system 100 may be any type of high performance etch chamber known in the art, such as, but not limited to, Enabler™, MxP®, MxP+™, Super-E™, DPS II AdvantEdge™ G3, or E-MAX® chambers manufactured by Applied Materials of CA, USA. Other commercially available etch chambers may similarly utilize the chuck assemblies described herein. While the exemplary embodiments are described in the context of the plasma etch system 100, the chuck assembly described herein is also adaptable to other processing systems used to perform any substrate fabrication process (e.g., plasma deposition systems, etc.) which place a heat load on the chuck.

Figure 5:
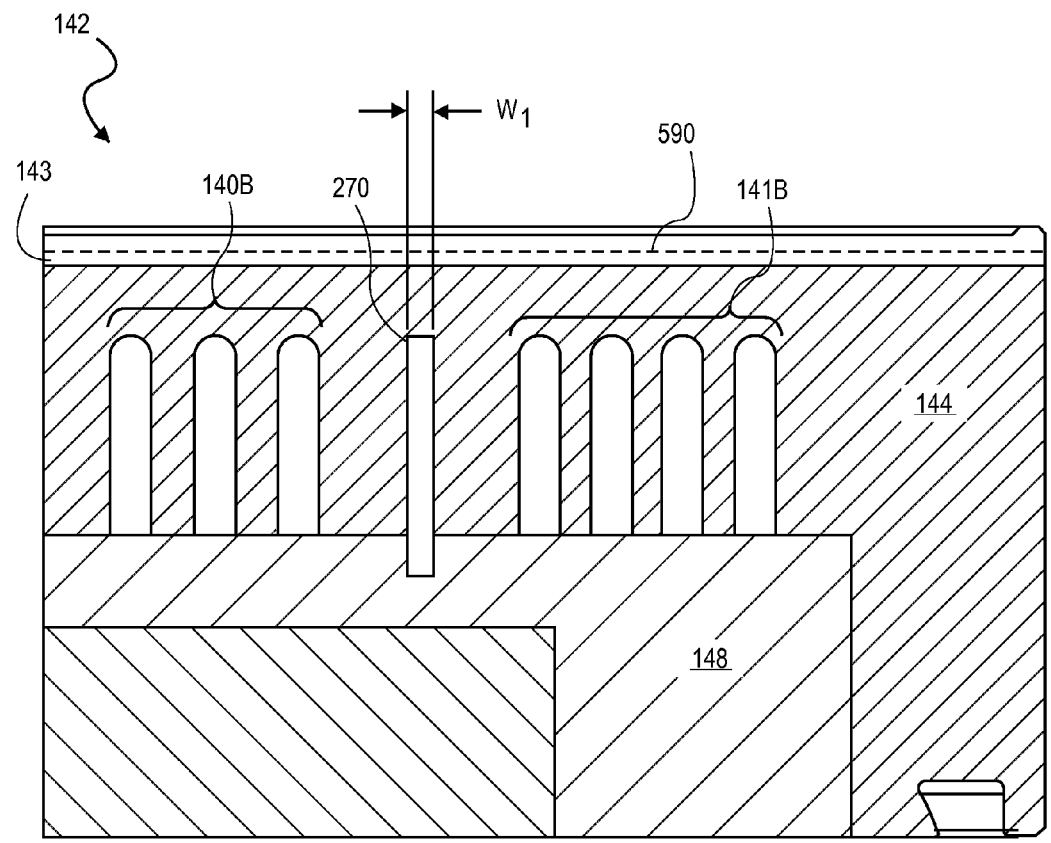
FIG. 5 illustrates an expanded cross-sectional view of the chuck assembly depicted in FIG. 2, in accordance with an embodiment of the present invention.

Referring to FIG. 1, the plasma etch system 100 includes a grounded chamber 105. A workpiece 110 is loaded through an opening 115 and clamped to a chuck assembly 142. The workpiece 110 may be any conventionally employed in the plasma processing art and the present invention is not limited in this respect. The workpiece 110 is disposed on a top surface of a dielectric layer 143 disposed over a cooling channel base 144. Embedded in the dielectric layer is a clamp electrode 590 (FIG. 5). In particular embodiments, chuck assembly 142 includes a plurality of zones, each zone independently controllable to a setpoint temperature. In the exemplary embodiment, an inner thermal zone is proximate to the center of the workpiece 110 and an outer thermal zone is proximate to the periphery/edge of the workpiece 110. Process gases are supplied from gas source(s) 129 through a mass flow controller 149 to the interior of the chamber 105. Chamber 105 is evacuated via an exhaust valve 151 connected to a high capacity vacuum pump stack 155.

When plasma power is applied to the chamber 105, a plasma is formed in a processing region over workpiece 110. A plasma bias power 125 is coupled into the chuck assembly 142 to energize the plasma. The plasma bias power 125 typically has a low frequency between about 2 MHz to 60 MHz, and may be for example in the 13.56 MHz band. In the exemplary embodiment, the plasma etch system 100 includes a second plasma bias power 126 operating at about the 2 MHz band which is connected to the same RF match 127 as plasma bias power 125 and coupled to a lower electrode 120 via a power conduit 128. A plasma source power 130 is coupled through a match (not depicted) to a plasma generating element 135 to provide high frequency source power to inductively or capacitively energize the plasma. The plasma source power 130 may have a higher frequency than the plasma bias power 125, such as between 100 and 180 MHz, and may for example be in the 162 MHz band.

The temperature controller 175 is to execute temperature control algorithms and may be either software or hardware or a combination of both software and hardware. The temperature controller 175 may further comprise a component or module of the system controller 170 responsible for management of the system 100 through a central processing unit 172, memory 173 and input/output interface 174. The temperature controller 175 is to output control signals affecting the rate of heat transfer between the chuck assembly 142 and a heat source and/or heat sink external to the plasma chamber 105. In the exemplary embodiment, the temperature controller 175 is coupled to a first heat exchanger (HTX)/chiller 177 and a second heat exchanger/chiller 178 such that the temperature controller 175 may acquire the temperature setpoint of the heat exchangers 177, 178 and temperature 176 of the chuck assembly, and control heat transfer fluid flow rate through fluid conduits in the chuck assembly 142. The heat exchanger 177 is to cool an outer portion of the chuck assembly 142 via a plurality of outer fluid conduits 141 and the heat exchanger 178 is to cool an inner portion of the chuck assembly 142 via a plurality of outer fluid conduits 140. One or more valves 185, 186 (or other flow control devices) between the heat exchanger/chiller and fluid conduits in the chuck assembly may be controlled by temperature controller 175 to independently control a rate of flow of the heat transfer fluid to each of the plurality of inner and outer fluid conduits 140, 141. In the exemplary embodiment therefore, two heat transfer fluid loops are employed. Any heat transfer fluid known in the art may be used. The heat transfer fluid may comprise any fluid suitable to provide adequate transfer of heat to or from the substrate. For example, the heat transfer fluid may be a gas, such as helium (He), oxygen ($O_2$), or the like, or a liquid, such as, but not limited to, Galden, Fluorinert, and ethylene glycol/water.

Figure 2:
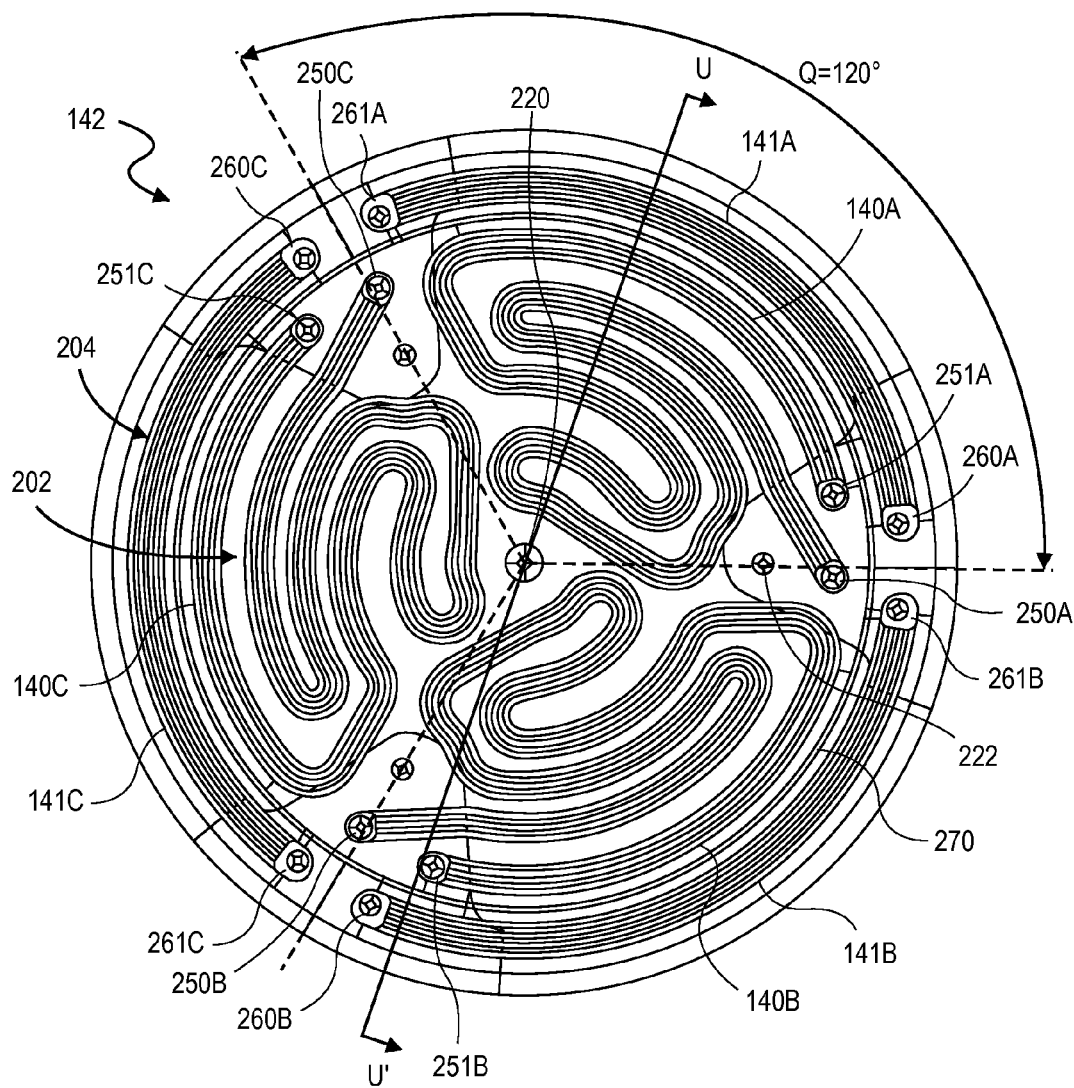
FIG. 2 illustrates a plan view of a chuck assembly including a plurality of inner fluid conduits and a plurality of outer fluid conduits, in accordance with an embodiment of the present invention.

FIG. 2 illustrates a plan view of the chuck assembly 142 without the dielectric layer 143. A plurality of inner fluid conduits 140 and a plurality of outer fluid conduits 141 are disposed in the cooling channel base 144 and are dimensioned to pass a heat transfer fluid at a desired flow rate for pressures typical in the art (e.g., 3 PSI). The fluid conduits 140, 141 may be routed around objects in the base, such as lift pin through holes 222 and a central axis 220 dimensioned to clear a conductor to provide DC voltage the clamp electrode 590 (FIG. 5). In some embodiments, each of the inner fluid conduits 140 have substantially equal fluid conductance and/or residence time to provide equivalent heat transfer fluid flow rates. In further embodiments, each of the outer fluid conduits 141 have substantially equal fluid conductance and/or residence time to provide equivalent heat transfer fluid flow rates. Fluid conductance may be either the same or different between the inner and outer fluid conduits 140 and 141. By utilizing a plurality of fluid conduits 140, 141, the length of each fluid conduit may be shortened, which may advantageously allow for a decreased change in temperature of the heat transfer fluid along the conduit. Total flow rate of heat transfer fluid throughout the substrate support may be increased for a given pressure, further facilitating a decreased temperature range of the substrate support during use.

In an embodiment, the plurality of inner fluid conduits 140 are disposed below an inner zone or portion 202 of the top surface extending outward from a central axis 220 to a first radial distance. The plurality of outer fluid conduits 141 are disposed below an outer zone or portion 204 the outer portion 604 forming an outer annulus centered about the central axis 220 and extending outward from a second radial distance to an outer edge of the chuck assembly 142. Each of the inner portion 202 and outer portion 204 may comprise any number of fluid conduits and may be arranged in any manner suitable to facilitate temperature uniformity across a top surface of the chuck assembly 142. For example, as depicted in FIG. 2, the inner portion 202 includes three inner fluid conduits 140A, 140B, and 140C having substantially (i.e., effectively) equal lengths between inlets 250A, 250B, 250C and outlets 251A, 251B, 251C, respectively. In further embodiments the plurality of inner fluid conduits 140 are positioned symmetrically about the central axis 220. For example, as illustrated in FIG. 2, the three inner fluid conduits 140A, 140B and 140C are symmetrical azimuthally with each inner fluid conduit spanning an azimuth angle φ of approximately 120°. As further depicted in FIG. 2, the outer portion 204 includes three outer fluid conduits 141A, 141B, and 141C, also azimuthally symmetric, spanning the same azimuth angle as each inner fluid conduit 140, and having substantially equal lengths between inlets 260A, 260B, 260C and outlets 261A, 261B, 261C, respectively. It should also be noted that the flow direction may be changed if desired, with any of the inlet 260A being exchangeable with the outlet 261A, 260B exchangeable with 261B, and 260C exchangeable with 261C. Similarly, for the inner flow conduits, the flow direction may be changed if desired, with any of the inlet 250A exchangeable with the outlet 251A, 250B exchangeable with 251B, and 250C exchangeable with 251C.

In an embodiment, an outlet (downstream end) of an inner fluid conduit 140 is positioned at a radial distance between an inlet (upstream end) of the inner fluid conduit 140 and an inlet of an outer fluid conduit 141. This may advantageously allow for a decreased change in temperature of the heat transfer fluid along the inner fluid conduit 141 and thus provide a more uniform temperature profile along a radius of the chuck assembly 142. As shown in FIG. 2, the inner conduit outlets 251A, 251B, 251C are each positioned between the inlet pairs 250A and 260A, 250B and 260B, 250C and 260C, respectively.

In an embodiment, a thermal break 270 is disposed in the cooling channel base 144 between the inner and outer fluid conduits 140, 141 to reduce cross talk between the inner and outer portions 202, 204. For the exemplary embodiment having an inner portion 202 extending outward from a central axis 220 to a first radial distance and an outer portion 204 forming an outer annulus centered about the central axis 220 which extends outward from a second radial distance to an outer edge of the chuck assembly 142, the thermal break 270 forms an annulus disposed a third radial distance between the first and second radial distances to encircle the inner portion 202. The thermal break 270 may be either a void formed in the cooling channel base 144, or a second material with a higher thermal resistance value than that of the surrounding bulk.

Figure 3:
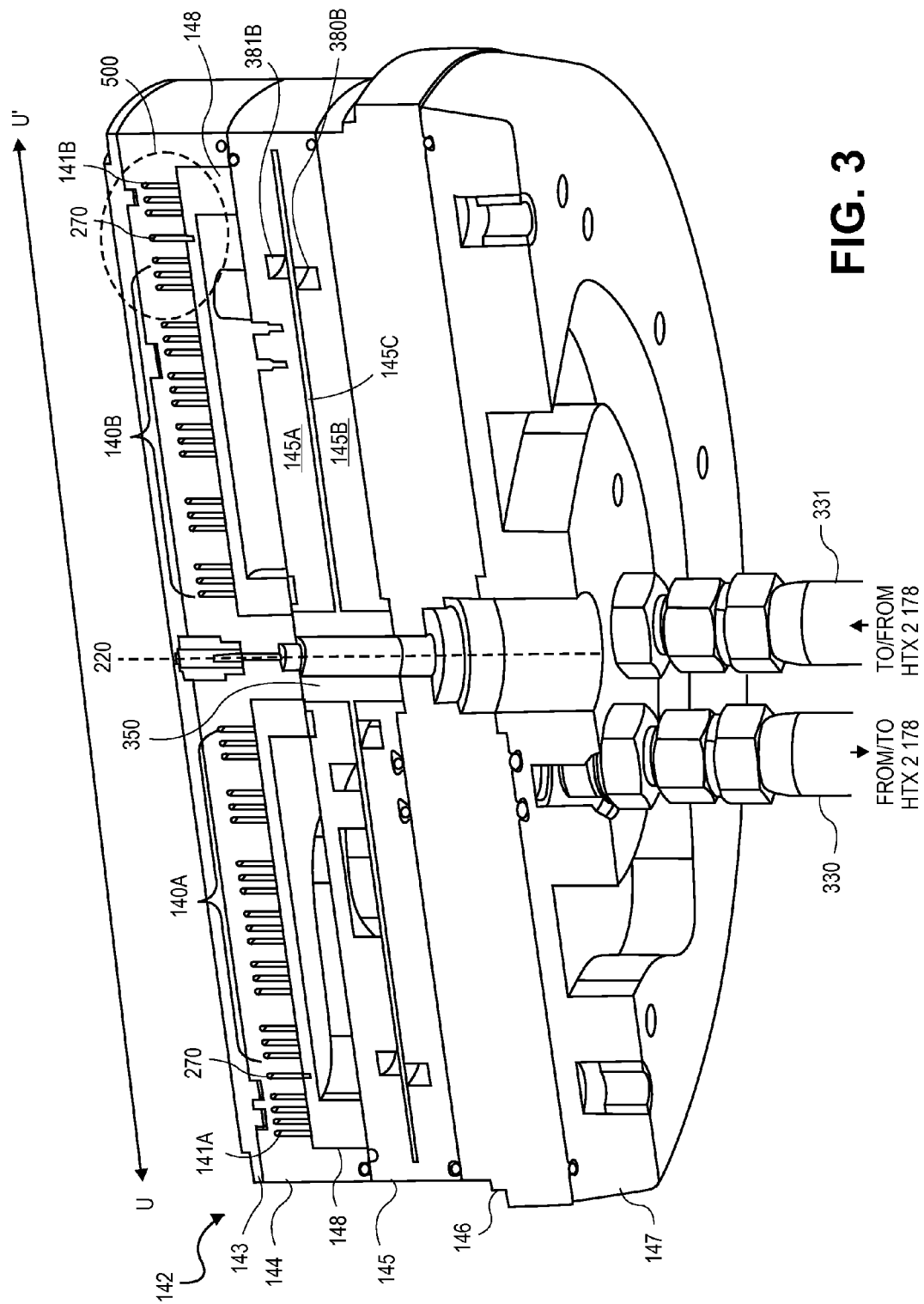
FIG. 3 illustrates an isometric sectional view of a chuck assembly, in accordance with an embodiment of the present invention

FIG. 3 illustrates an isometric sectional view of the chuck assembly 142, in accordance with an embodiment of the present invention. The section depicted in FIG. 3 is taken along the U-U' line illustrated in FIG. 2. As shown in FIG. 3, the thermal break 270 is a void formed in the cooling channel base 144. The void may either be unpressurized, positively or negatively pressurized. In alternative embodiments where the thermal break 270 is of a thermally resistive material, the thermal break 270 may be a material (e.g., ceramic) having greater thermal resistivity than that utilized as the cooling channel base 144 (which may be, for example, aluminum).

In embodiments, and as depicted in FIG. 3, at least a portion of the one or more fluid conduits 140, 141 are machined into the cooling channel base 144. In the exemplary embodiment, at least one of the inner and outer fluid conduits 140, 141 include a plurality of channels formed within a first plate of the cooling channel base 144 that is mated with an underlying base plate 148 to seal the channels. The channels comprising one inner conduit 140 (e.g., 140A) conduct fluid in parallel and share the single inlet and single outlet of the particular fluid conduit. Similarly, the channels comprising one outer conduit 141 (e.g., 141A) conduct fluid in parallel and share the single inlet and single outlet of a particular fluid conduit. As shown in FIG. 3, and further in FIG. 5 illustrating an expanded view of the region 500 in FIG. 3, the thermal break 270 extends into both the cooling channel base 144 and the base plate 148 to reduce thermal coupling between the inner and outer portions 202 and 204. As shown in FIG. 5, the thermal break 270 extends into the cooling channel base 144 by an amount approximately equal to that of the fluid conduits 140, 141, enabling concurrent machining. The thermal break 270 also extends into the base plate 148 by an amount at least equal to the radial width of the break ($W_1$). Generally, the radial width, $W_1$, of the thermal break 270 may vary, but a void 0.030 to 0.100 inches has been found to provide significant reduction in cross-talk between the portions 202 and 204.

In embodiments, each of the plurality of inner fluid conduits 140 are coupled to a common heat transfer fluid source, as described above with respect to FIG. 1. Alternatively, in some embodiments, a separate heat transfer fluid source may be coupled to each inner conduit inlet 250A, 250B, 250C individually. Similarly, each of the plurality of outer fluid conduits 141 are coupled to a common heat transfer fluid source, as described above with respect to FIG. 1. Alternatively, in some embodiments, a separate heat transfer fluid source may be coupled to each outer conduit inlet 260A, 260B, 260C individually. To couple the plurality of fluid conduits 140, 141 is a common heat transfer fluid source, embodiments of the chuck assembly include a fluid distribution plate to distribute and/or collect heat transfer coolant to and/or from the plurality of fluid conduits 140, 141.

Returning to FIG. 3, the chuck assembly 142 includes a fluid distribution plate 145 disposed below the cooling channel base 144 and the base plate 148. The fluid distribution plate 145 has an annular shape with an inner diameter dimensioned to couple with an RF power conductor 350 for an RF power source (not depicted). The cooling channel base 144 and base plate 148 is also RF powered for exemplary embodiments where each are made of electrically conductive materials and are in mechanical contact with the fluid distribution plate 145. In embodiments, the fluid distribution plate 145 is a conductive material, such as aluminum, and is machined to include one or more levels of conduit forming manifolds. In embodiments, and as depicted in FIG. 3, the fluid distribution plate 145 includes an outlet manifold level 145A and an inlet manifold level 145B. Outlet manifold(s) may include a channel formed within the outlet manifold level 145A that is mated with a plate 145C to form an outlet manifold branch 381B while the inlet manifold(s) may include a channel formed within the inlet manifold level 145B that is also mated with the intervening plate 145C to form an inlet manifold branch 380B. The plate 145C may be of the same material as bulk of the fluid distribution plate (e.g., aluminum). Heat transfer fluid passed by the output/input couplings 330 and 331 from/to the HTX 2 178 affixed to the chuck assembly base 147 is routed up through an insulator layer 146 to a common upstream/downstream end of the manifolds formed in the distribution plate 145.

Figure 4A:
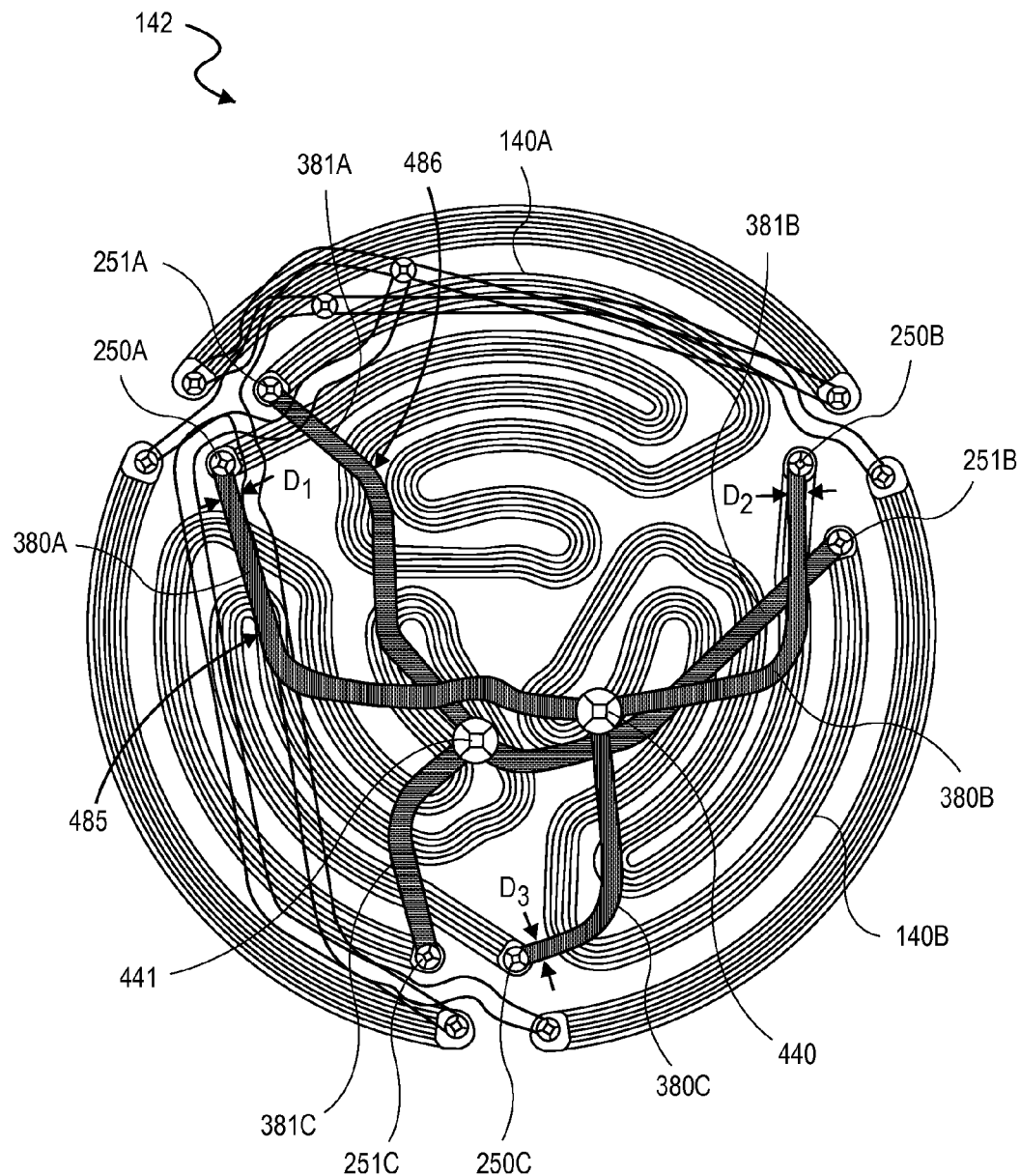
FIG. 4A illustrates a plan view of inner input and output fluid distribution manifolds, in accordance with an embodiment of the present invention.

FIG. 4A illustrates a plan view of exemplary inner input fluid distribution manifold 485 and inner output fluid distribution manifold 486, in accordance with an embodiment of the present invention. As shown, the inner input manifold 485 has a common upstream end (inlet) 440 and manifold branches 380A, 380B and 380C extending to a plurality of downstream ends (outlets) which are coupled to respective inner fluid conduit inlets 250A, 250B, 250C. Unlike the inner fluid conduits 140 which may be highly symmetrical about the axis 220 with the conduits having same lengths and cross-sections, the branches of at least one of the inner input manifold 485 and inner output manifold 486 have unequal lengths to accommodate the RF power and/or DC voltage input extending along the central axis 220. Nonetheless, in embodiments, fluid conductance is equal between all branches of the inner input manifold 485 to facilitate equal splitting of a total flow provided at the upstream end 440 across the plurality of inner fluid conduits 140 (e.g. ⅓ total flow in each of 140A, 140B, and 140C). Generally, cross sections of the manifold branches are varied to arrive at substantially equal flow rates between the branches. In one embodiment where substantially rectangular manifold branches have the same height, widths $D_1$, $D_2$ and $D_3$ of inner input manifold branches 380A, 380B, 380C, respectively, are unequal and sized based on the branch lengths to arrive at substantially equal flow rates in the branches 380A, 380B, 380C. For example, $D_1$ is dimensioned to be larger than $D_3$ because the flow length of branch 380A is longer than that of 380C. In alternative embodiments, heights of substantially rectangular manifold branches are made unequal to equilibrate fluid flow rates between separate manifold branches. Known fluid dynamic relationships may be utilized to appropriately dimension the various branches to achieve equal flow rates. Further, computational fluid dynamic simulations may be used to adjust the cross sections of the different branches and achieve equal flow rates.

As further shown in FIG. 4A, the inner output manifold 486 has a common downstream end (outlet) 441 and branches 381A, 381B, and 381C extending to a plurality of upstream ends (inlets) coupled to respective outlets 251A, 251B, 251C of the inner fluid conduits 140A, 140B, 140C. In further embodiments, the fluid conductance is equal between all the outer output manifold branches. As such, in an embodiment, cross-sections of outer output manifold branches 381A, 381B, 381C, respectively, are unequal and sized based on the output manifold branch length.

Figure 4B:
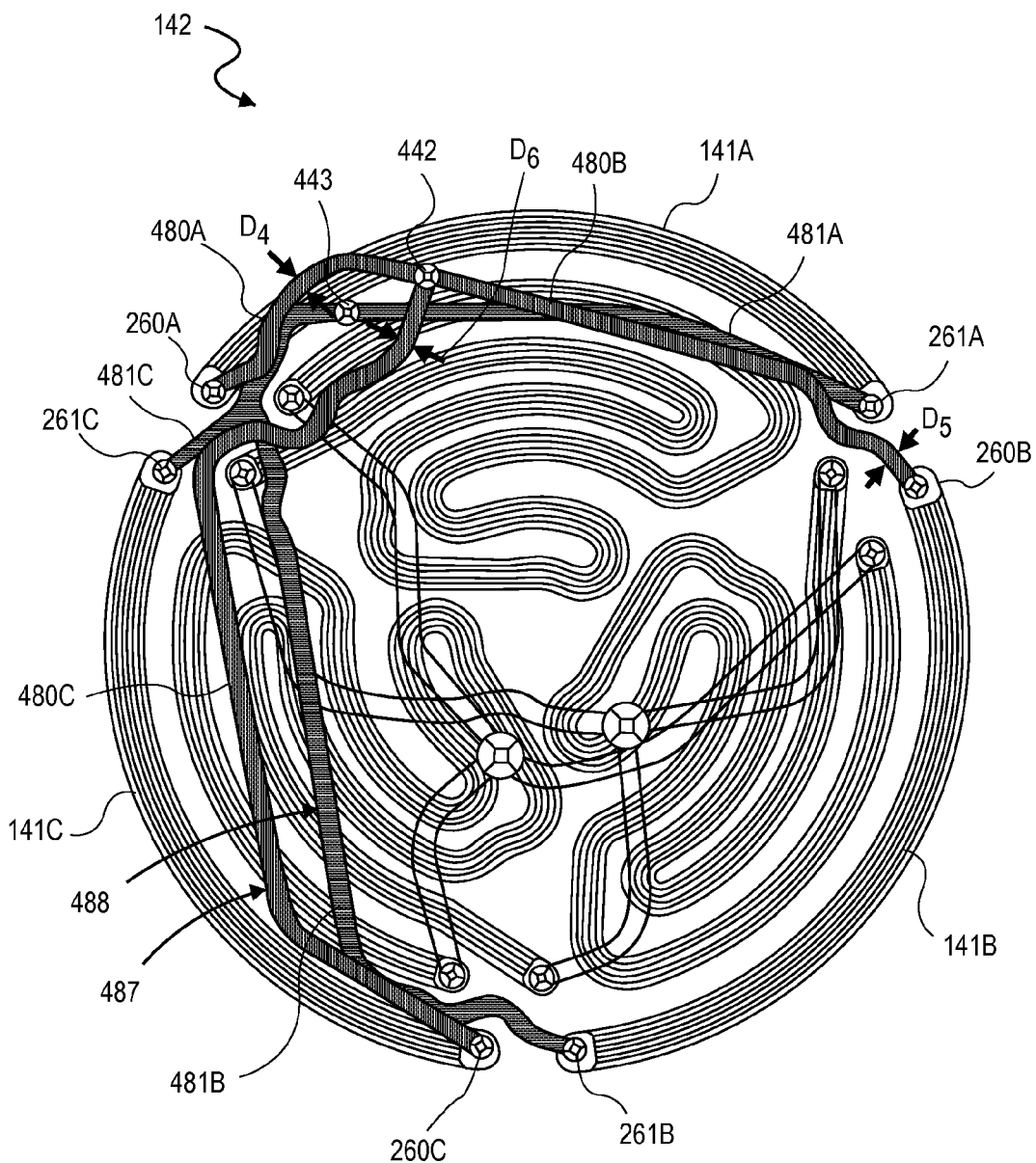
FIG. 4B illustrates a plan view of outer input and output fluid distribution manifolds, in accordance with an embodiment of the present invention.

FIG. 4B illustrates a plan view of outer input fluid distribution manifold 487 and outer output fluid distribution manifold 488, in accordance with an embodiment of the present invention. As shown, the outer input manifold 487 has a common upstream end (inlet) 442 and manifold branches 480A, 480B, and 480C extending to a plurality of downstream ends (outlets) which are coupled to respective inlets 260A, 260B, 260C of the outer fluid conduits 141A, 141B, and 141C. Unlike the outer fluid conduits 141 which may be highly symmetrical about the central axis 220 with each conduit having the same length and cross-section, the branches of at least one of the outer input manifold 487 and outer output manifold 488 have unequal lengths to accommodate the inner input and output manifolds 485, 486. Nonetheless, in embodiments, fluid conductance is equal between all branches of the outer input manifold 487 to facilitate equal splitting of a total flow provided at the upstream end 442 across the plurality of outer fluid conduits 141 (e.g., ⅓ total flow in each of 141A, 141B, and 141C). Generally, cross sections of the manifold branches are varied to arrive at substantially equal flow rates between branches of a manifold. As such, in embodiment, inner widths $D_4$, $D_5$ and $D_6$ of the outer input manifold branches 480A, 480B, 480C, respectively, are unequal and sized based on the branch lengths to arrive at substantially equal flow rates between the branches 480A, 480B, 480C. For example, $D_4$ is dimensioned to be larger than $D_5$ because the flow length of branch 480C is longer than that of 380B.

As further shown in FIG. 4B, the outer output manifold 488 has a common downstream end (outlet) 443 and branches 481A, 481B, and 481C extending to a plurality of upstream ends (inlets) coupled to respective outlets 261A, 261B, 261C of the outer fluid conduits 141A, 141B, 141C. In further embodiments, the fluid conductance is equal between all the outer output manifold branches. As such, in embodiment, cross-sections of outer output manifold branches 481A, 481B, 481C, respectively, are unequal and sized based on the output manifold branch length.

Although the present invention has been described in language specific to structural features and/or methodological acts, it is to be understood that the invention defined in the appended claims is not necessarily limited to the specific features and embodiments described. Accordingly, the foregoing description is by way of example only and is not intended as limiting. The invention is limited only as defined in the following claims and the equivalents thereto.

What is claimed is:

1. A chuck assembly for supporting a workpiece during a manufacturing operation, the chuck assembly comprising:
   a top surface of a dielectric layer to support the workpiece;
   a cooling channel base disposed beneath the top surface;
   a base plate disposed beneath the cooling channel base; and
   a thermal break disposed within the cooling channel base and extending into the base plate.

2. The chuck assembly of claim 1, wherein the thermal break comprises a void.

3. The chuck assembly of claim 2, wherein the void is unpressurized.

4. The chuck assembly of claim 2, wherein the void is positively pressurized.

5. The chuck assembly of claim 2, wherein the void is negatively pressurized.

6. The chuck assembly of claim 1, wherein the thermal break comprises a second material with a higher thermal resistance value than that of the cooling channel base.

7. The chuck assembly of claim 6, wherein the second material is ceramic.

8. The chuck assembly of claim 1, further comprising fluid conduits that extend from a top surface of the base plate and into the cooling channel base.

9. The chuck assembly of claim 8, wherein the thermal break extends into the cooling channel base by an amount equal to that of the fluid conduits.

10. The chuck assembly of claim 1, wherein the thermal break has a radial width.

11. The chuck assembly of claim 10, wherein the thermal break extends into the base plate by an amount at least equal to the radial width.

12. The chuck assembly of claim 11, wherein the radial width ranges between 0.03 to 0.10 inches.

13. The chuck assembly of claim 1, further comprising a first heat transfer fluid loop and a second heat transfer fluid loop.

14. The chuck assembly of claim 13, wherein the first and second heat transfer fluid loop each are coupled to a separate heat exchanger.

15. The chuck assembly of claim 13, wherein a portion of the first and second heat transfer fluid loops are disposed within the cooling channel base.

16. The chuck assembly of claim 15, wherein the portion of the first heat transfer fluid loop is separated from the portion of the second heat transfer fluid loop by the thermal break.

* * * * *